US009684026B2

(12) United States Patent
Wei et al.

(10) Patent No.: US 9,684,026 B2
(45) Date of Patent: Jun. 20, 2017

(54) APPARATUS AND METHOD FOR AUTOMATIC GROUND FAULT LOCATION DETERMINATION IN HIGH RESISTANCE GROUNDED MOTOR DRIVE SYSTEM

(71) Applicants: Lixiang Wei, Mequon, WI (US); Jeffrey D. McGuire, Franklin, WI (US); Jiangang Hu, Grafton, WI (US); Zhijun Liu, Menomonee Falls, WI (US)

(72) Inventors: Lixiang Wei, Mequon, WI (US); Jeffrey D. McGuire, Franklin, WI (US); Jiangang Hu, Grafton, WI (US); Zhijun Liu, Menomonee Falls, WI (US)

(73) Assignee: Rockwell Automation Technologies, Inc., Mayfield Heights, OH (US)

( * ) Notice: Subject to any disclaimer, the term of this patent is extended or adjusted under 35 U.S.C. 154(b) by 810 days.

(21) Appl. No.: 14/048,156

(22) Filed: Oct. 8, 2013

(65) Prior Publication Data

US 2015/0097571 A1    Apr. 9, 2015

(51) Int. Cl.

| | |
|---|---|
| *G01R 31/08* | (2006.01) |
| *G01R 31/02* | (2006.01) |
| *B60L 3/04* | (2006.01) |
| *G01R 31/00* | (2006.01) |
| *H02H 3/16* | (2006.01) |
| *B60L 3/00* | (2006.01) |

(52) U.S. Cl.
CPC .......... *G01R 31/088* (2013.01); *B60L 3/0069* (2013.01); *B60L 3/04* (2013.01); *G01R 31/005* (2013.01); *G01R 31/025* (2013.01); *H02H 3/16* (2013.01); *B60L 2220/42* (2013.01); *Y02T 10/648* (2013.01); *Y02T 90/16* (2013.01)

(58) Field of Classification Search
CPC .. G01R 31/088; G01R 31/025; G01R 31/005; B60L 3/04; B60L 3/0069; B60L 2220/42; H02H 3/16; Y02T 10/648; Y02T 90/12
USPC ....................................... 324/531
See application file for complete search history.

(56) References Cited

U.S. PATENT DOCUMENTS

| | | | |
|---|---|---|---|
| 5,909,367 | A | 6/1999 | Change |
| 6,348,800 | B1 | 2/2002 | Haensgen et al. |
| 6,984,988 | B2 | 1/2006 | Yamamoto |
| 7,102,355 | B1 | 9/2006 | Kumar |
| 7,498,819 | B2 | 3/2009 | Kumar |
| 7,751,993 | B2 | 7/2010 | Mirafzal |

(Continued)

FOREIGN PATENT DOCUMENTS

| | | |
|---|---|---|
| EP | 1 914 557 A2 | 4/2008 |
| EP | 2 439 827 A2 | 4/2012 |

OTHER PUBLICATIONS

European Search Report mailed Feb. 9, 2015 for Application No. EP 14 18 8203.5.

*Primary Examiner* — Melissa Koval
*Assistant Examiner* — Courtney McDonnough
(74) *Attorney, Agent, or Firm* — Fay Sharpe LLP

(57) ABSTRACT

A PLC or other industrial controller programmed to locate ground faults in a networked high resistance grounded multi-drive system through network communications messaging to automatically place networked motor drives in various operational states to isolate individual drives for ground fault identification testing and selectively identify individual drives as suspected ground fault locations.

21 Claims, 7 Drawing Sheets

(56) References Cited

U.S. PATENT DOCUMENTS

| | | |
|---|---|---|
| 7,933,108 B2 | 4/2011 | Tallam |
| 8,149,551 B2 | 4/2012 | Vedula |
| 8,319,466 B2 | 11/2012 | Valdez et al. |
| 8,478,552 B2 | 7/2013 | Morita et al. |
| 2011/0153234 A1 | 6/2011 | Winterhalter et al. |
| 2011/0175619 A1* | 7/2011 | Bauer .................. B60L 3/0069 324/510 |
| 2012/0086458 A1 | 4/2012 | Wei et al. |
| 2012/0112757 A1 | 5/2012 | Vrankovic et al. |
| 2012/0249038 A1 | 10/2012 | Wei et al. |
| 2013/0218491 A1 | 8/2013 | Wei et al. |
| 2015/0097571 A1 | 4/2015 | Wei |

* cited by examiner

APPARATUS AND METHOD FOR AUTOMATIC GROUND FAULT LOCATION DETERMINATION IN HIGH RESISTANCE GROUNDED MOTOR DRIVE SYSTEM

BACKGROUND

Multi-drive systems are employed in a variety of automated industrial applications in which two or more motor drives are operated via a distributed power system, typically using power derived from a shared AC or DC power source. High resistance grounding (HRG) is often employed in such power distribution configurations to allow system components to continue operation during ground fault conditions, with high grounding impedances being used to limit the amount of ground fault current to allow continued safe system operation as well as to facilitate detection of ground faults. When a ground fault situation is detected, however, it may be difficult to identify the source of the fault condition, particularly where many motor drives are connected to a single power source. In a typical situation, service personnel must shut down or deactivate all the drives on a shared DC bus or shared AC connection, and repeatedly test individual drives in an often lengthy process of elimination to determine which drive has a grounding problem. At each drive, a ground current measurement must be taken while the drive is running, which prevents usage of that drive and the other deactivated drives during the troubleshooting procedure, and also requires operation of the connected motor for ground fault testing, which may be disadvantageous in certain manufacturing situations. Conventional techniques for locating the source of ground faults are thus time-consuming and costly in terms of system downtime as well as labor costs for service personnel. Accordingly, a need remains for improved techniques and apparatus for ground fault location determination in motor drive systems.

SUMMARY

One or more aspects of the present disclosure are now summarized to facilitate a basic understanding of the disclosure, wherein this summary is not an extensive overview of the disclosure, and is intended neither to identify certain elements of the disclosure, nor to delineate the scope thereof. Rather, the primary purpose of this summary is to present various concepts of the disclosure in a simplified form prior to the more detailed description that is presented hereinafter. The present disclosure provides apparatus and methods for automatically identifying one or more suspected ground fault locations in multi-drive systems by which the above-described shortcomings of conventional techniques may be avoided or mitigated.

An automated method for identification of suspected ground fault locations is provided in accordance with one or more aspects of the present disclosure, in which a controller, such as a programmable logic controller or PLC is connected to communicate with multiple drives via a communications network. The method involves using the controller to select a first motor drive, automatically disable the non-selected drives, and to determine whether a ground fault is detected in this system condition. If so, the selected drive is identified as a suspected ground fault location. The method further includes using the controller to then select another drive and repeat the process in automated fashion to individually isolate drives associated with a ground fault or to individually exonerate the drives as fault location suspects. In this manner, an operator or service personnel can interact with the controller, such as through a control room or control panel of a distributed control system, and quickly locate the source of a ground fault problem for further investigation and remedial action. By this method, moreover, significant time and cost can be saved by reducing system downtime and reducing the labor costs associated with field service personnel visiting and manually testing each motor drive in a multi-drive system. Moreover, even where the nature and extent of a detected ground fault condition will allow for continued system usage, the techniques of the present disclosure advantageously facilitate informed intelligent reporting to system operators both that a ground fault condition exists, and expeditious identification of one or more likely locations which should be targeted for maintenance or further testing with little or no human interaction involved in the initial diagnosis.

Certain embodiments of the method further include disabling all the drives and determining whether a ground fault condition is detected when a system main circuit breaker is closed, to thereby identify a system input or common DC bus as a suspected ground fault location. In addition, certain implementations include specific testing for DC side ground faults and/or testing for motor side ground faults through selective messaging provided to set the operational states of networked motor drives and their included local drive disconnect switches and/or output inverter switches. Moreover, certain embodiments advantageously provide for controlled operation of a connected motor for determining whether a motor side fault condition exists, or the controller may send a special command to the motor drive to place one or more inverter switching devices in a zero vector state allowing determination of whether a motor side fault exists without rotation of a connected motor. The disclosed methods thus advantageously facilitate a relatively fine granularity in the amount of automatically or semi-automatically obtained diagnostic information with respect to detected ground faults with little or no system downtime and with minimal operator interaction.

In accordance with further aspects of the present disclosure, non-transitory computer readable mediums are disclosed which include computer executable instructions for performing the ground fault location identification methods.

In addition, controller apparatus is disclosed for automatically identifying suspected ground fault locations in a multi-drive system, including electronic memory, a network interface, and at least one processor equipped to communicate with motor drives via a connected communications network. The processor is programmed to automatically select and enable one of the motor drives for testing while disabling the remaining drives via network messaging, as well as to automatically identify the selected drive as a suspected ground fault location if a fault is detected while the selected drive is enabled, and to repeat the process for one or more other drives.

BRIEF DESCRIPTION OF THE DRAWINGS

The following description and drawings set forth certain illustrative implementations of the disclosure in detail, which are indicative of several exemplary ways in which the various principles of the disclosure may be carried out. The illustrated examples, however, are not exhaustive of the many possible embodiments of the disclosure. Other objects, advantages and novel features of the disclosure will be set forth in the following detailed description when considered in conjunction with the drawings, in which.

DETAILED DESCRIPTION

Figure 1:
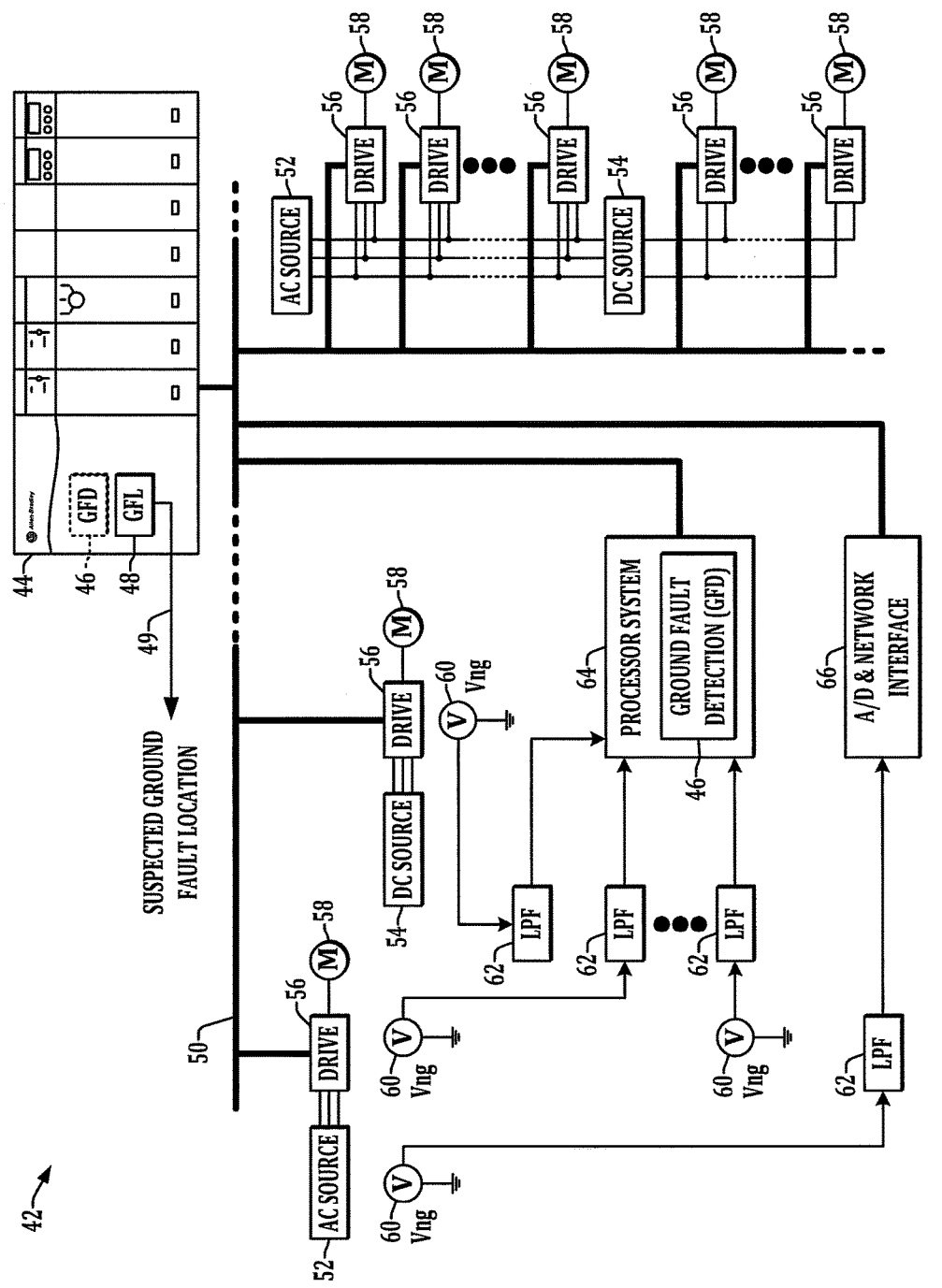
FIG. 1 is a system diagram illustrating a networked multi-drive system with a programmable logic controller connected to a plurality of motor drives via a network for driving multiple motor loads in which the controller implements a ground fault location system in accordance with one or more aspects of the present disclosure.

Referring now to the figures, several embodiments or implementations are hereinafter described in conjunction with the drawings, wherein like reference numerals are used to refer to like elements throughout, and wherein the various features are not necessarily drawn to scale.

Figure 2:
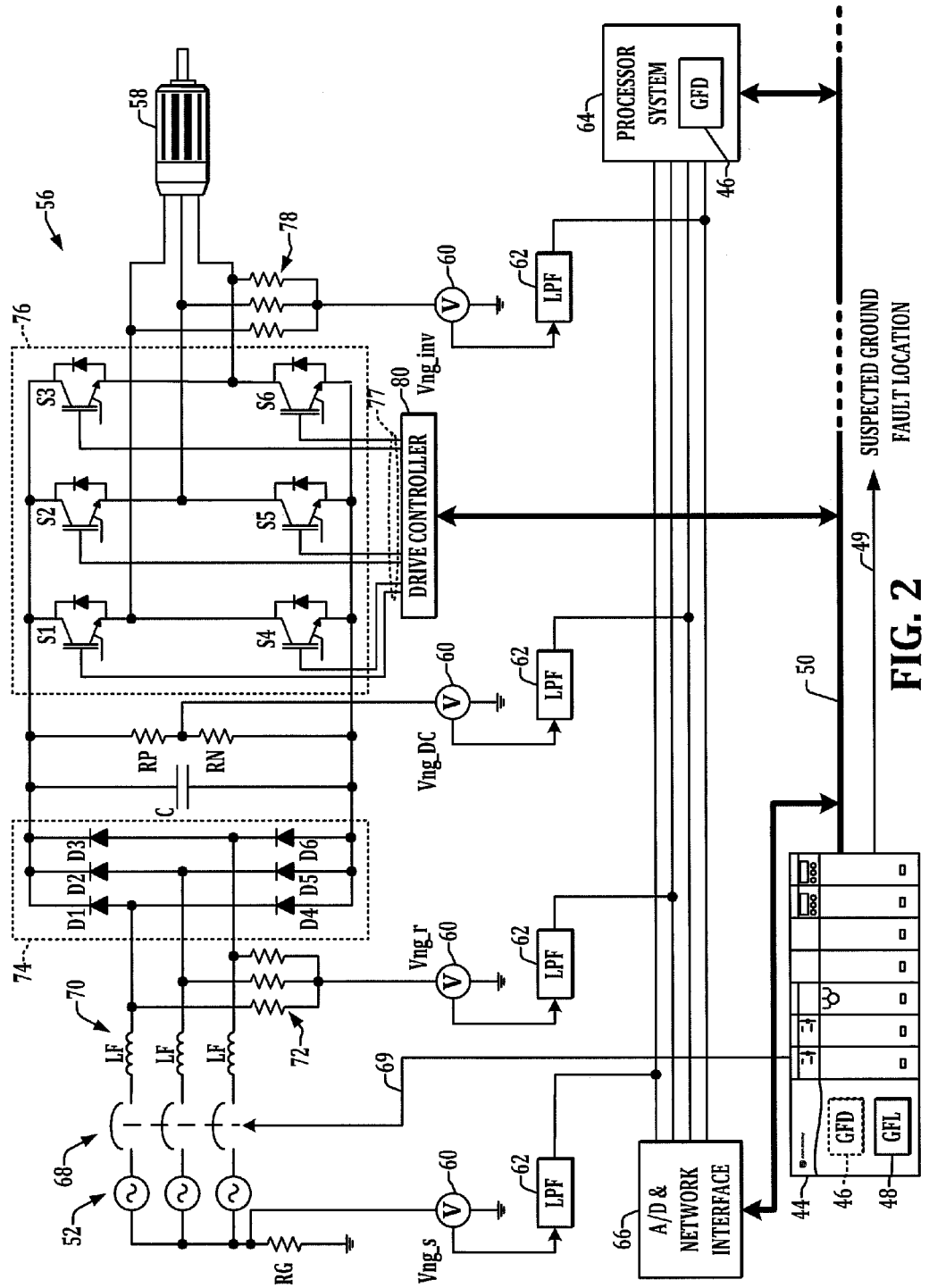
FIG. 2 is a schematic diagram illustrating an exemplary motor drive in the multi-drive system of FIG. 1.
Figure 3:
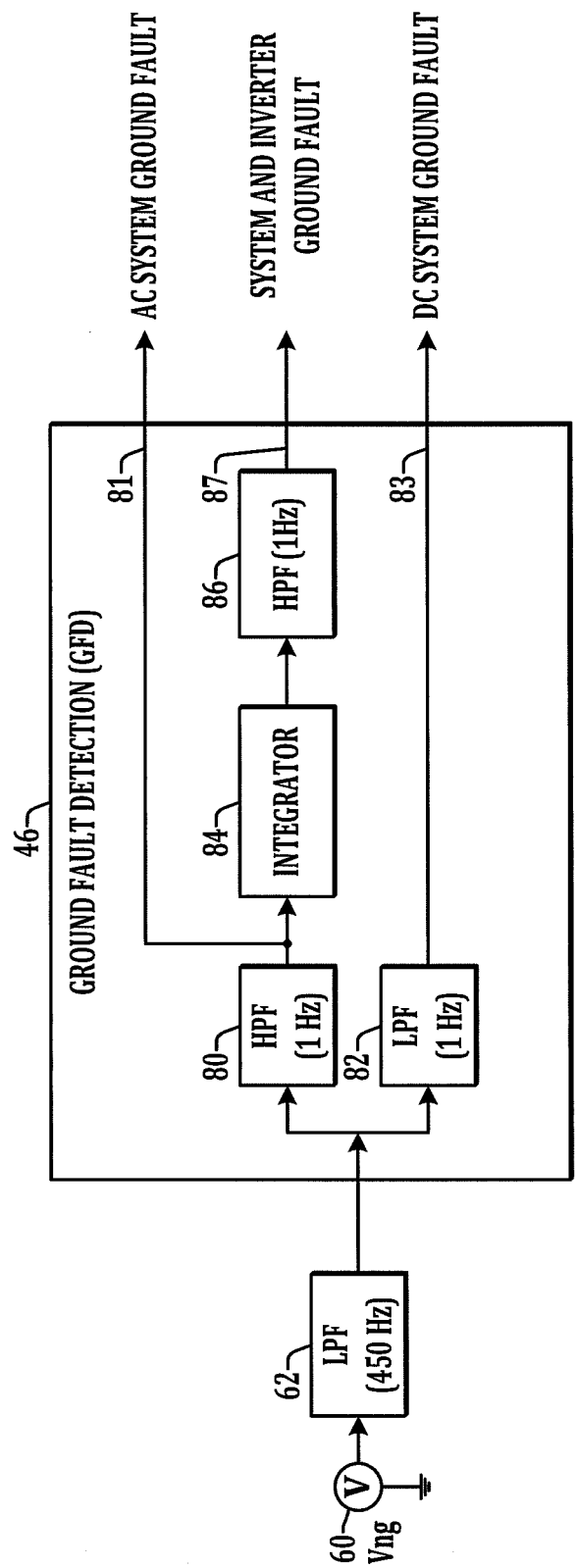
FIG. 3 is a schematic diagram illustrating an exemplary ground fault detection system providing a plurality of ground fault detection signals in accordance with one or more aspects of the present disclosure.
Figure 4:
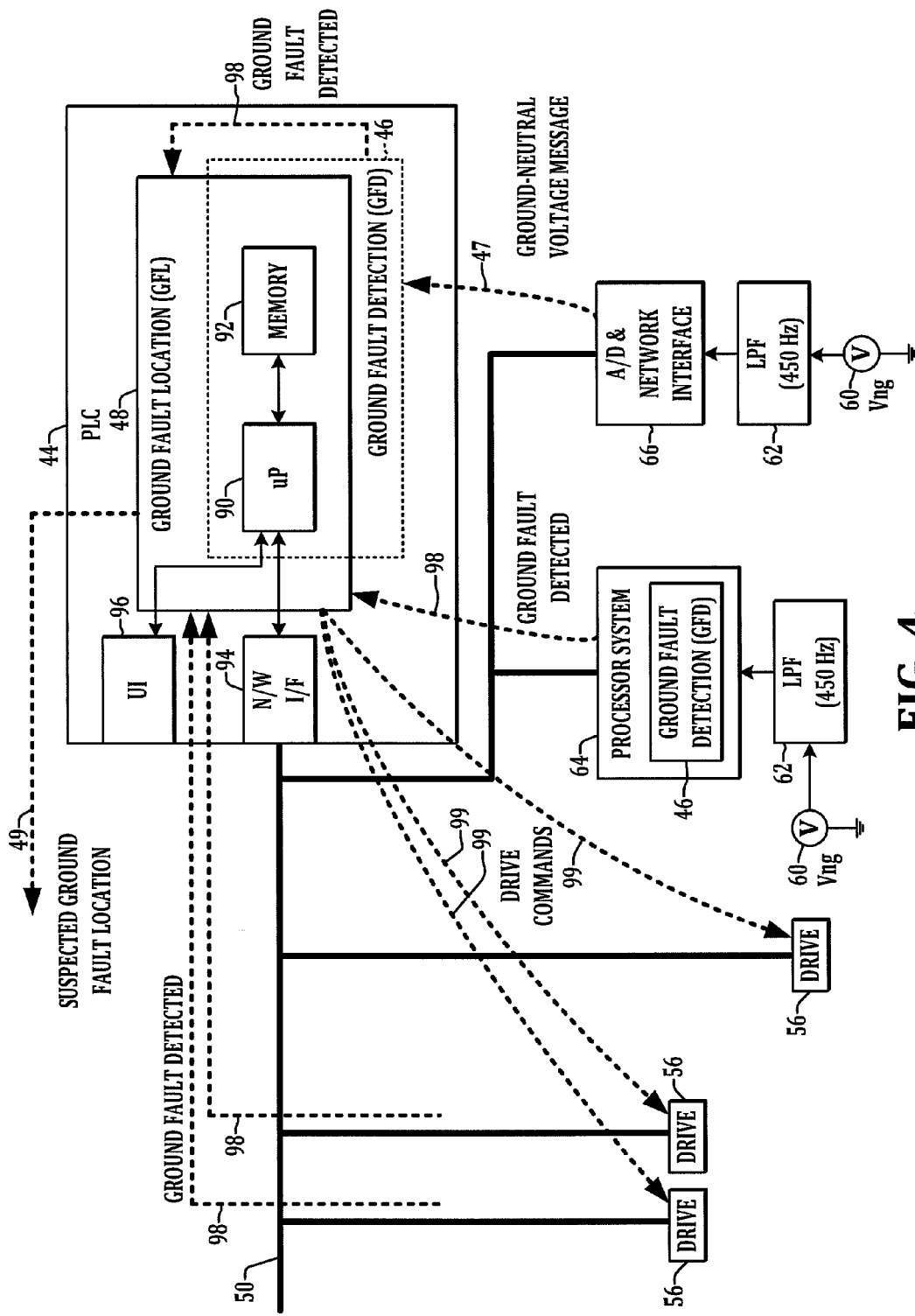
FIG. 4 is a schematic diagram illustrating an exemplary programmable controller implementing a ground fault location system in accordance with the present disclosure.

Referring initially to FIGS. 1-4, the disclosed embodiments provide methods and apparatus for automatic ground fault location determination, which may be employed in a variety of distributed multi-drive environments. The various concepts of the present disclosure, moreover, can be implemented in an industrial controller such as a programmable logic controller (PLC) or other processor-based control apparatus to implement a ground fault location (GFL) system 48 by way of any suitable hardware, processor-executed software, processor-executed firmware, programmable logic, analog circuitry, etc. which provides the described functionality as set forth herein, and may be operative using one or more processor elements executing computer executable instructions stored in an electronic memory of the system. FIG. 4 illustrates an exemplary microprocessor 90 of a PLC controller 44 having electronic memory 92 and a network interface 94 along with a user interface 96 that can be used in one possible implementation. Any suitable memory 92 can be used, such as a computer memory, a memory within a PLC 44 or power converter control system (e.g., controller 80), a CD-ROM, floppy disk, flash drive, database, server, computer, etc. which has computer executable instructions for performing the ground fault location functionality described herein. The GFL system 48, moreover, may include one or more components, which may be implemented as software and/or firmware components in execution, programmable logic, etc., which is/are operatively, communicatively, coupled with a network 50 for interaction and messaging exchanges with motor drives 56, processor systems 64 and other network interface devices 66 that are also connected to the network 50. In this regard, any suitable networking technology 50 can be used for operatively interconnecting the system components 44, 56, 64, 66, etc., including without limitation Ethernet networks, wired and/or wireless networks, general purpose industrial networks, general purpose industrial networks such as ControlNet, industrial Ethernet networks such as Ethernet/IP, etc., fieldbus networks, such as PointIO (PointBus) used for communicating with I/O modules connected to a backplane bus, or the like or combinations thereof. In one non-limiting example, for instance, the GFL system 48 can be implemented in a ControlLogix® PLC controller 44 or other suitable controller such as those provided by Rockwell Automation, Inc.

Figure 6:
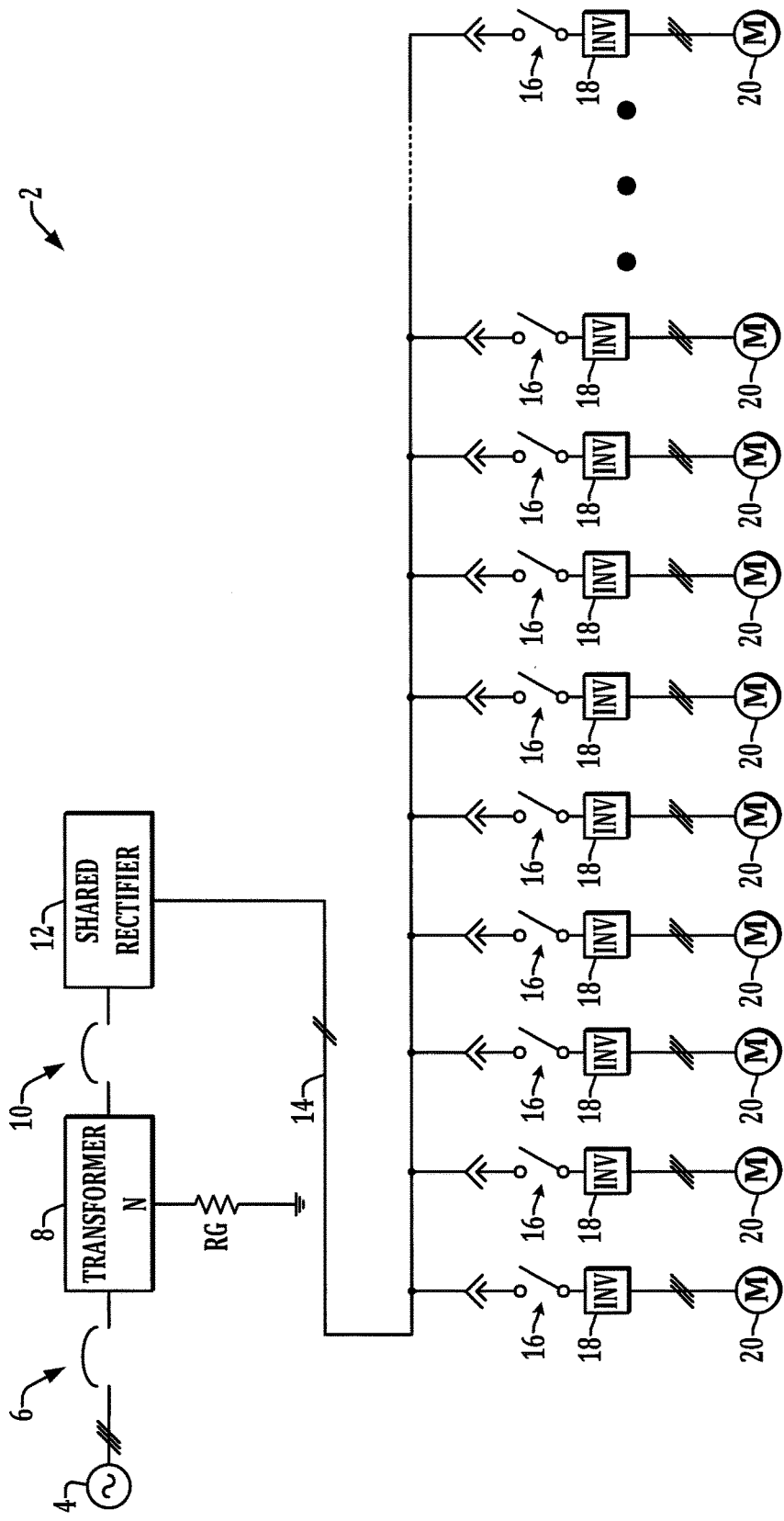
FIG. 6 is a system diagram illustrating an exemplary shared DC bus multi-drive system.
Figure 7:
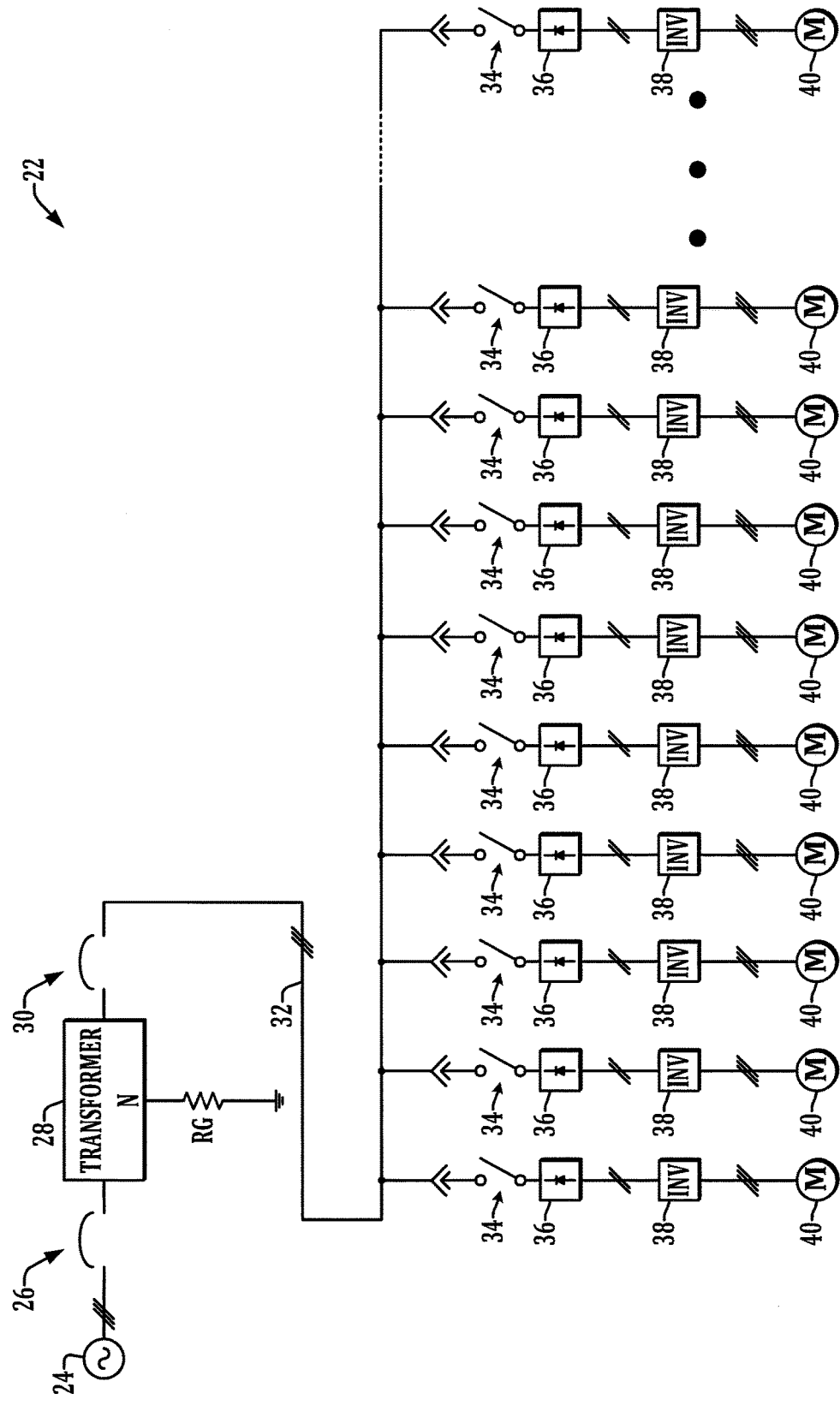
FIG. 7 is a system diagram illustrating an exemplary shared AC bus multi-drive system.

Referring briefly to FIGS. 6 and 7, the methods and controllers of the present disclosure can be used in connection with a variety of different multi-drive systems. FIG. 6 illustrates a shared DC bus multi-drive system 2 in which a three-phase AC input source 4 is connected to a transformer 8 by a three-phase switch or breaker 6, with a high resistance grounding resistor RG connecting the transformer secondary neutral "N" to ground using known high resistance grounding techniques, such as a resistor to limit ground fault current to about 1-10 A, thereby allowing the system to operate even if one or more ground fault conditions occur in the system 2. The secondary of the transformer 8 is connected through a three-phase breaker 10 to the input of a shared or common rectifier 12 which provides a common DC output bus 14 to drive a number of inverters 18. Each of the drives in this case includes an inverter 18 providing a three-phase variable frequency, variable amplitude AC output to drive a connected AC motor load 20, and each drive also includes a local power disconnect switch 16 to disconnect the inverter input from the shared DC bus 14. FIG. 7 shows a shared AC system 22 in which an AC input 24 provides three-phase AC power via a breaker 26 to a transformer 28 whose secondary neutral is grounded via a resistor RG, and whose output provides a shared three-phase AC bus 32 with a system breaker 30 optionally provided at the output of the transformer secondary. In this case, a plurality of drives are connected to the shared AC bus 32, and individually include a local drive disconnect switch 34 connected between the shared AC bus 32 and a local rectifier stage 36. The rectifier 36 provides a DC bus as an input to a local inverter 38, which in turn provides a three-phase output to drive a connected AC motor load 40 as shown. It is noted in FIGS. 6 and 7 that ground faults may occur at various points within the systems 2, 22. For instance, a ground fault can occur at the transformer 8 in FIG. 6 or at the secondary of the transformer 28 in FIG. 7. Alternatively or in combination, a ground fault could occur on the motor side of the drive inverters 18, 38 in either system 2, 22. Furthermore, ground fault conditions are possible at the DC-side of the motor drives, including along the shared DC bus 14 in FIG. 6, or at the local inverter inputs in FIG. 6. Also, DC side faults could occur in the rectifiers 36 of the drives in FIG. 7. As seen in FIGS. 6 and 7, therefore, manually diagnosing a detected ground fault condition in either system 2 or 22 is time-consuming and labor-intensive, particularly where large systems are involved.

Referring again to FIGS. 1-4, the present disclosure advantageously provides automated diagnostic techniques and controllers 44 by which the location of one or more ground faults can be easily identified, while limiting the system downtime and manual effort, particularly compared with conventional ground fault location approaches. FIG. 1 illustrates a multi-drive system 42 including a programmable logic controller or PLC 44 connected to an Ethernet or ControlNet network 50, as well as a plurality of motor drives 56 driving associated AC motor loads 58, where the drives 56 are each connected to an associated AC source 52 or DC source 54. As shown, moreover, several drives 56 may be powered from a shared AC or DC source 52, 54, and different drives 56 may be powered by separate sources 52,

54 in a variety of different technologies or configurations, wherein the various concepts of the present disclosure are not limited to any particular power distribution architecture.

Various sensors 60 may be disposed at various points within the system to measure one or more neutral-ground voltages indicated in the figures as Vng, and the sensor outputs may be optionally filtered using hardware low pass filters (LPF) 62 suitable for use in detecting the presence of a ground fault. In the illustrated example, the outputs of the low pass filters 62 can be provided to a processor systems 64 that implements a ground fault detection (GFD) system 46, such as through suitable analog to digital (A/D) conversion circuitry and processor-executed programming to generate one or more signals or values or messages for provision to the controller 44 through the network 50 indicating that a ground fault has been detected by one of the sensors 60. Moreover, one or more of the motor drives 56 may internally provide one or more sensors 60 for measuring neutral-ground voltages or other operating parameters and generating suitable ground fault detection signals or messages for provision to the controller 44 via the network 50 indicating detection of ground faults at or proximate the corresponding motor drive 56. Moreover, as seen in FIG. 1, the PLC 44 may also implement a ground fault detection system 46, for internally generating flags, or values, or other status indicators indicating that a fault has been detected based on received messaging indicating a value of one of the neutral-ground voltages Vng from the sensors 60 that indicates a ground fault has occurred. For instance, an A/D converter and network interface component 66 may receive the output of one or more of the low pass filter 62 and provide one or more network messages to the controller 44 through the network 50 indicating the value of the received signal, by which the ground fault detection system 46 of the PLC controller 44 may ascertain whether the received value is indicative of the presence of a ground fault condition in the system 42.

FIG. 2 illustrates further details of an exemplary motor drive 56, receiving AC input power through a local drive disconnect switch 68 from an AC source 52, where the drive 56 in this example includes input filter inductors LF 70, and a passive rectifier 74 including diodes D1-D6 providing a DC bus voltage across a bus capacitor C. The DC bus voltage is provided as an input to an inverter stage 76 including active switching devices S1-S6 operated according to switching control signals 77 from a drive controller 80. In addition, the PLC 44 in this example provides a control signal 69 to operate the local drive disconnect switch 68 or this could be operated manually, with the PLC 44 optionally automatically prompting such manual operation. The drive controller 80 can be any suitable hardware, processor-executed software, processor-executed firmware, programmable logic, analog circuitry, etc. which provides the described functionality as set forth herein, and may be operative using one or more processor elements executing computer executable instructions stored in an electronic memory of the drive 56. In other embodiments, an active front end rectifier 74 may be used, for example, to implement active front end control for power factor correction and/or for regenerative drive operation according to suitable rectifier switching control signals (not shown) from the drive controller 80. Moreover, alternate embodiments are possible using a current source rectifier 74 and a current source inverter 76, and which include one or more DC link chokes with the capacitor C being omitted. The inverter stage 76 provides an AC output having controlled frequency and amplitude in order to the switching control signals 77 to drive a motor load 58 as shown.

The drive controller 80, moreover, is operatively connected to the network 50 in order to exchange control commands, data and other information with the PLC 44 and other devices on the network 50. In particular, the drive controller 80 is operative to receive commands from the PLC 44 and to alter the operation of the drive 56 accordingly, including provision of the inverter switching control signals 77 and/or control of the operational state of the local drive disconnect switch 68 via the control signal 69. In this manner, the PLC 44 can implement a ground fault location system 48 which sends various network messages to particular drive controllers 80 to selectively place various motor drives 56 in different operating states and thereby provide intelligent troubleshooting to identify suspected ground fault locations within a multi-drive system. Non-limiting examples include the capability of the PLC 44 to send one or more network messages to deactivate the inverter 76 by instructing the drive controller 80 to turn off all the switching devices S1-S6, or to operate the inverter switches S1-S6 to rotate the motor load 58 according to a given frequency command, or to instruct the drive controller 80 to turn on specific ones of the inverter switches S1-S6, for example, to implement a zero vector switching state in which all the upper switches S1-S3 are on while the lower switches S4-S6 are off or vice versa, in order to provide a test condition without rotating the motor load 58. Moreover, the PLC 44 may use network messaging to instruct the drive controller 80 to place the local drive disconnect switch 68 in a desired state, either open or closed in order to implement the ground fault location system functionality as described herein. Furthermore, the illustrated drive controller 80 is programmed to implement various motor control functions associated with operation of the motor drive 56 as are known.

As previously noted, sensor apparatus 60 may be provided at various locations to measure neutral-ground or other voltages or operating parameters associated with operations of the drives 56 as well as other locations within a multi-drive system. For example, as illustrated in FIG. 2, a sensor 60 is operatively connected to measure a neutral-ground voltage Vng_s associated with the AC source 52, such as the voltage across the grounding resistor RG in one example, and provides a sensor signal as an input to an optional low pass filter 62. The filter output provides an input to an AC/D and network interface component 66, which in turn provides a value to the PLC 44 through the network 50. In addition, line-neutral sense resistors 72 are connected from the rectifier input terminals between the filter inductors 70 and the rectifier 74 with the rectifier neutral voltage Vng_r being measured by another sensor 60 that provides a signal to the A/D and network interface component 66 through another low pass filter 62. In this example, moreover, positive and negative DC bus sense resistors RP and RN are connected in series with one another across the DC bus in parallel with the capacitor C, and are of substantially equal impedance values to provide a DC mid-point voltage Vng_DC sensed by a corresponding sensor 60 and associated low pass filter 62. The example of FIG. 2 also includes output neutral voltage sense resistor 78 connected as shown to allow measurement by a sensor 60 of an inverter neutral-ground voltage Vng_inv.

One or more of the sensors 60 and/or the low pass filters 62 shown in FIG. 2 may be integrated into the corresponding motor drive 56 or may be separate components. Where provided, moreover, the component 66 may receive analog signals directly from the sensor 60 and/or from any provided intervening low pass filters 62, and may provide corresponding digital values to the PLC 44 accordingly. In this case, the PLC 44 may implement a ground fault detection system 46 which determines whether a ground fault condition is suspected based on one of the received values according to any suitable ground fault identification or ground fault detection technique or algorithm. As further shown FIG. 2, moreover, a processor system 64 may receive the analog measured signals directly from the sensors 60 and/or from associated low pass filters 62, and may implement an on-board ground fault detection system 46, with the processor system 64 providing ground fault detection indications via network messaging to the PLC 44 via the network 50. Furthermore, the ground fault detection system 46 may also be implemented by the drive controller 80, with the controller 80 receiving signals from the sensors 60 and/or from any associated low pass filters 62 and providing network messaging including indications of detected ground fault conditions through the network 50 to the PLC 44.

As best shown in FIG. 3, one possible implementation of a ground fault detection (GFD) system 46 is illustrated, which may be implemented in the PLC 44, in a separate processor system 64, and/or in the drive controller 80 or other processor-based system in the motor drive 56. There may be other similar ground fault location identification methods that can be used as well, wherein the illustrated example is but one possible implementation. As seen in FIG. 3, the exemplary ground fault detection system 46 includes high pass and low pass filter components 80 and 82, respectively, in one case implementing corresponding cut in and cut off frequencies, with the external low pass filters 62 having a higher cutoff frequency. One suitable on-board example for the ground fault detection system 46 is illustrated and described in co-pending US patent application publication number 2003/0218491 A1 to Wei et al., published Aug. 22, 2013, and assigned to the assignee of the present disclosure, the entirety of which is hereby incorporated by reference as if fully set forth herein. In the illustrated non-limiting example, moreover, the GFD system 46 provides an AC system ground fault indication 81, as well as a system and inverter ground fault indication 87 and/or a DC system ground fault indication 83, where the output indications 81, 83 and 87 can be any suitable form of analog signal, digital message, etc. In addition to the filters 80 and 82, the GFD system 46 includes an integrator component 84 and another high pass filter 86 having a cut in frequency of about 1 Hz connected in series with the integrator 84 to provide the system and inverter ground fault indication 87. The components 80, 82, 84 and 86 of the ground fault detection system 46 may be implemented using any suitable hardware, processor-executed software, processor-executed firmware, programmable logic, analog circuitry, etc. which provides the described ground fault detection functionality as set forth herein, and may be operative using one or more processor elements executing computer executable instructions stored in an electronic memory.

As best seen in FIGS. 2 and 4, the ground fault location system 48 provides an output 49, such as a network message or other signal or value, indicating one or more suspected ground fault locations in a given multi-drive system based on operation of various drives and other components of the system in a ground fault location mode of operation according to received ground fault detection indications 98 from the various ground fault detection systems 46. In this regard, the ground fault detection indications 98 may be any suitable form of analog signal, digital message, etc. As seen in FIG. 4, the PLC 44 includes a processor 90 and associated electronic memory 92, with the processor 90 being operatively coupled with the memory 92 as well as a network interface component 94 and a user interface component 96. As is known, the PLC 44 may be any suitable type of industrial control apparatus, such as a rack-mounted system including one or more modules connected to a common backplane bus for connection of I/O and networks, including an industrial network 50, for example, ControlNet. As schematically shown in FIG. 4, moreover, the ground fault location system 48 is configured by suitable programming instructions in the PLC 44 (e.g., stored as program instructions in the memory 92 in one example), by which the GFL system 48 sends drive commands 99 to one or more of the networked motor drives 56, and receives ground fault detection indications 98 from one or more of the drive 56 and/or from a separate processor system 64 implementing a ground fault detection system 46 and/or from a ground fault detection system 46 implemented in the PLC 44 to internally provide detection indications 98 based on received ground-neutral voltage messages 47 (e.g., from the A/D and network interface component 66 as described above).

Figure 5:
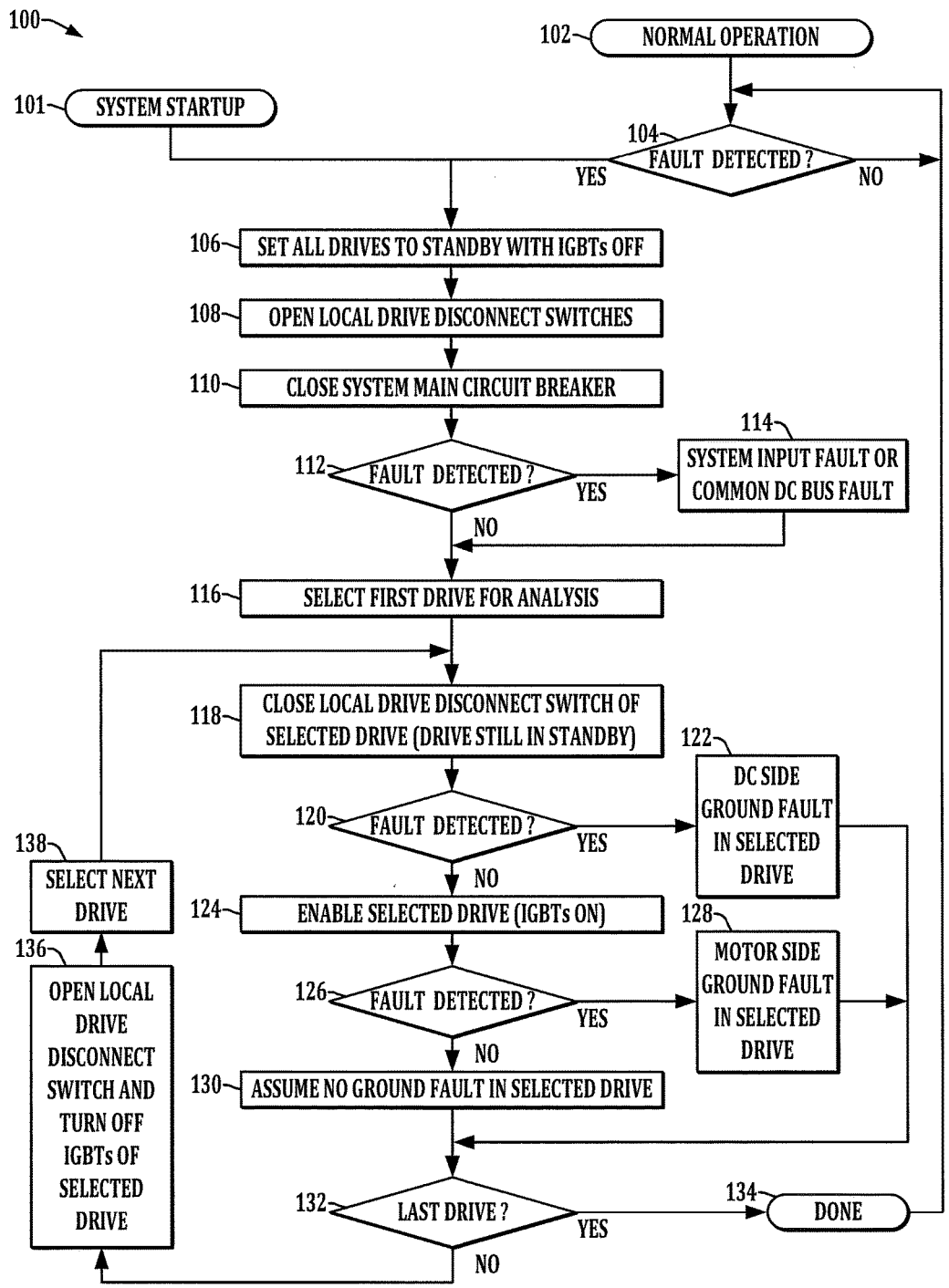
FIG. 5 is a flow diagram illustrating an exemplary method for identifying suspected ground fault locations in a multi-drive system in accordance with further aspects of the disclosure.

FIG. 5 illustrates a flow diagram showing an exemplary method 100 for identifying suspected ground fault locations in a multi-drive system, wherein the processor 90 of the PLC 44 in FIG. 4 may implement the ground fault location system 48 generally in accordance with the process 100 of FIG. 5 in certain non-limiting embodiments. The process 100 is illustrated and described below in the form of a series of acts or events, although the various methods of the disclosure are not limited by the illustrated ordering of such acts or events. In this regard, except as specifically provided hereinafter, some acts or events may occur in different order and/or concurrently with other acts or events apart from those illustrated and described herein in accordance with the disclosure. In addition, not all illustrated steps may be required to implement a process or method in accordance with the present disclosure, and one or more such acts may be combined. The illustrated method 100 and other methods of the disclosure may be implemented in hardware, processor-executed software, processor-executed firmware, programmable logic, or combinations thereof, such as in the exemplary PLC 44, and may be embodied in the form of computer executable instructions stored in a tangible, non-transitory computer readable medium, such as in the electronic memory 92 operatively associated with the processor 90 in the example of FIG. 4. Moreover, although illustrated as being implemented in the PLC 44, any suitable processor-based system may be used to implement the GFL system 48, having suitable interconnections to provide commands 99, directly or indirectly, to a plurality of motor drive 56 and which can receive ground fault detection indications 98, directly or indirectly, from various sources, wherein the various concepts of the present disclosure are not limited to implementation in a programmable logic controller or in any specific host system.

As seen in FIG. 5, the process 100 can be performed at any suitable time such as at system startup (101). Also, at any suitable time during normal operation 102, the fault location identification process 100 can be initiated based on detection of a fault at 104. In the ground fault location mode of operation, the illustrated PLC 44 in one embodiment sends suitable network messaging at 106 (e.g., drive commands 99 in FIG. 4 above) to set all drives to standby mode with the inverter switches (e.g., IGBTs) off. In addition, the PLC 44 sends suitable network commands or messages to open the local drive disconnect switches 68 at 108 (e.g., local drive disconnect switch 68 in FIG. 2 above). For instance, the PLC 44 can send one or more commands or messages 99 at 106 and 108 as a single broadcast message or as individual messages to specific ones of the motor drives 56 to cause the local drive controllers 80 (FIG. 2) to turn off all the associated switching devices S1-S6 of the corresponding inverters 76 and/or to open or close the local drive disconnect switches 68. In addition, the PLC 44 in certain embodiments may be programmed to send commands or messages through the network 50 to operate a system main circuit breaker (e.g., to close the system main circuit breaker 6, 10, 26 and/or 30 in FIGS. 6 and 7) at 110 in FIG. 5, or this may be done manually. The transition from normal operation 102 to begin the ground fault location operation may be fully automatic, or semi-automatic, or may be user-initiated, for example, by service personnel interacting with the user interface 96 associated with the PLC 44. In one non-limiting embodiment, the PLC 44 may determine that a fault has been detected (YES at 104 and FIG. 5), and request confirmation that the ground fault location test mode should be initiated, and await a confirming signal or message from the user interface 96.

With all the drives 56 in standby mode (with switches S1-S6 off) at 106, the local drive disconnect switches opened at 108, and the main circuit breaker(s) closed at 110, the PLC makes a determination at 112 as to whether a ground fault has been detected (e.g., based on the ground fault detected indications 98 from the drives 56, the processor system 64 and/or from an internally implemented ground fault detection system 46 in FIG. 4). If so (YES at 112), the PLC identifies a system input or common DC bus as a suspected ground fault location at 114. In certain embodiments, the PLC 44 issues a suspected ground fault location signal or message 49 at 114, for instance, by sending a message including the suspected fault location to one or more control components operatively associated with the network 50 and/or may provide an indication of the suspected ground fault location via the user interface 96 (FIG. 4).

Following the identification of a system input or common DC bus fault at 114, or if no fault is detected (NO at 112), the process 100 continues at 116 where the controller 44 selects a single one of the motor drives 56 for testing or analysis, where the selection can be based on any suitable ordering, or may be based on operator input (e.g., via the user interface 96 of FIG. 4). At this point, with a single selected drive 56 isolated for evaluation, the PLC 44 enables the selected drive 56 and determines at 120 and 126 whether a ground fault is detected, and selectively identifies the selected drive as a suspected location of a ground fault if a fault is detected while the selected drive is enabled and all the non-selected drives are disabled. In one possible implementation, the PLC 44 sends at least one command or message at 118 in FIG. 5 (e.g., drive commands 99 in FIG. 4) to close the local drive disconnect switch 68 of the selected drive 56, while all the remaining (non-selected) motor drives 56 remain disabled with their local disconnect switches having been previously opened at 106 and 108 above. A determination is made at 120 as to whether a fault is detected in this condition (e.g., based on any received indications 98 of ground fault conditions), and if so (YES at 120), the PLC selectively identifies a DC side ground fault at the selected motor drive 56 at 122 in FIG. 5.

If no fault is detected with the selected drive in standby mode, and the local drive disconnect switch closed (NO at 120), the PLC 44 uses suitable network messaging to enable the selected drive at 124. Enablement of the selected drive at 124 in certain implementations involves activation of one or more of the inverter switching devices S1-S6, and may be done in one embodiment such that a connected motor 58 is caused to rotate, or alternatively may be done in such a manner (e.g., using zero vector switching command signals 77 by the local drive controller 80) such that the connected motor 58 does not rotate.

In one non-limiting embodiment, the PLC 44 sends at least one command or message 99 at 124 to cause the selected drive 56 to turn on at least one inverter switching device S1-S6 to cause the selected drive 56 to rotate the connected motor 58, for example, by sending the drive 56 a specific motor speed command message 99. This causes the controller 58 to generate suitable pulse width modulation switching control signals 77 to drive the motor 58 to the designated speed, for example, in a closed loop fashion according to normal motor drive inverter control operating principles. In another possible implementation at 124, the PLC 44 sends suitable command inputs 99 to the selected drive 56 to accelerate the driven motor 58 from stop to a designated speed for a predetermined time, such as about 5-10 seconds in one example. It is further noted that where the illustrated ground fault detection system 46 (FIG. 3) provides multiple ground fault detection indication outputs 81, 83 and/or 87, the ground fault location system 48 implemented in the PLC 44 can advantageously employ the system and inverter ground fault indication 87 during operation of the motor load 58 associated with the selected motor drive 56 at 124 as the tested indication of an associated inverter ground fault condition.

In another possible implementation, the PLC 44 sends at least one command or message 99 to the selected drive 56 at 124 to turn on at least one inverter switch S1-S6 while preventing rotation of the connected motor 58. For example, a predetermined message 99 can be sent to the selected drive 56 at 124 to initiate the provision of a "zero vector" switching pattern by the selected drive controller 80, for instance, to turn on the three upper switches S1-S3 while turning off the lower switches S4-S6. Alternatively, different zero vector patterns can be used by the selected drive controller 80, for example, to turn off the upper switches S1-S3 while turning on the lower switches S4-S6. In this manner, the driven motor 58 or the inverter output is electrically connected to the DC bus to facilitate determination of whether a motor side ground fault condition is present, while advantageously preventing the driven motor 58 from rotating, which can be useful in an industrial environment in which it is desirable to prevent motor rotation during troubleshooting.

With the selected drive enabled at 124, the PLC 44 makes a determination at 126 in FIG. 5 as to whether a ground fault condition is detected. If so (YES at 126), the controller 44 selectively identifies a motor side ground fault at the selected motor drive 56 at 128, and otherwise (NO at 126), the selected drive is exonerated at 130 as not being suspected as a location of a ground fault condition.

Thereafter, a determination is made at 132 as to whether all the drives 56 have been evaluated with respect to ground faults. If so (YES at 132), the ground fault location process 100 is completed at 134, and the PLC 44 can return the multi-drive system to normal operation at 102 and 104, and provide the suspected ground fault location or locations in the form of a user interface indication and/or a network message 49. Otherwise (NO at 132), the local drive disconnect switch 68 of the selected drive 56 is opened and the selected drive 56 is disabled at 136, and the PLC 44 selects the next drive 56 for evaluation at 138. The PLC 44 then returns to repeat the process 100 to selectively identify one or more suspected locations of ground faults or to exonerate further motor drives 56 at 118-132 as described above. It is noted that the processing at 106-138 may be performed in an entirely automated fashion using any suitable processor implemented system 48, such as the illustrated and described PLC configuration. Alternatively or in combination, one or more steps may be user-prompted, with certain user inputs or decisions being used in the processing 100. Thus, fully automatic or semi-automatic ground fault location processing is achieved by which one or more suspected ground fault locations can be quickly identified, with the PLC 44 initiating a suspected ground fault location report or message 49 to indicate to an operator that (1) one or more ground faults have been detected and (2) to provide a list of one or more suspected locations. This, in turn, can be used by an operator or by a network control component to request and/or schedule preventative maintenance or to initiate or take other remedial measures, wherein service personnel can directly attend to testing or evaluation of the suspected location and forgo exhaustive testing of every drive in a multi-drive system.

The above examples are merely illustrative of several possible embodiments of various aspects of the present disclosure, wherein equivalent alterations and/or modifications will occur to others skilled in the art upon reading and understanding this specification and the annexed drawings. In particular regard to the various functions performed by the above described components (assemblies, devices, systems, circuits, and the like), the terms (including a reference to a "means") used to describe such components are intended to correspond, unless otherwise indicated, to any component, such as hardware, processor-executed software, or combinations thereof, which performs the specified function of the described component (i.e., that is functionally equivalent), even though not structurally equivalent to the disclosed structure which performs the function in the illustrated implementations of the disclosure. In addition, although a particular feature of the disclosure may have been disclosed with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

The following is claimed:

1. An automated method for identifying candidate ground fault locations in a high resistance grounded multi-drive system with a multiphase AC source including a neutral connected to a system ground through a high resistance, the method comprising:
(i) using a controller with at least one processor operative to communicate with a plurality of motor drives via a communications network, selecting a first one of a plurality of motor drives as a single selected motor drive for testing;
(ia) using the controller, closing a system main circuit breaker to connect the multiphase AC source to the plurality of motor drives or to a shared rectifier;
(ii) using the controller, disabling all non-selected ones of the plurality of motor drives;
(iii) using the controller, enabling the single selected motor drive;
(iv) using the controller, determining whether a ground fault is detected while the single selected motor drive is enabled and all the non-selected motor drives are disabled;
(v) using the controller, selectively identifying the single selected motor drive as a candidate location of a ground fault if a ground fault is detected while the single selected motor drive is enabled and all the non-selected motor drives are disabled; and
(vi) using the controller, selecting at least one remaining untested motor drive of the plurality of motor drives for testing, and repeating steps (ii)-(v) to selectively identify one or more candidate locations of the ground fault or to eliminate further ones of the plurality of motor drives from consideration as ground fault locations.

2. The method of claim 1, further comprising:
(vii) using the controller, disabling all of the plurality of motor drives;
(viii) using the controller, determining whether a ground fault is detected while all of the plurality of motor drives are disabled and the system main circuit breaker is closed; and
(ix) using the controller, selectively identifying a system input or common DC bus as a candidate location of a ground fault if a ground fault is detected while all of the plurality of motor drives are disabled and the system main circuit breaker is closed.

3. The method of claim 2, wherein (iii) enabling the single selected motor drive and (iv) determining whether a ground fault is detected while the single selected motor drive is enabled comprises:
testing for DC side ground faults by:
(a) sending at least one command or message from the controller to cause the single selected motor drive to close an associated local drive disconnect switch to connect the single selected motor drive to an AC input power source while turning off all inverter switching devices of the single selected motor drive;
(b) using the controller, determining whether a ground fault is detected while the associated local drive disconnect switch is closed and all the inverter switching devices of the single selected motor drive are turned off; and
(c) using the controller, selectively identifying a DC side ground fault at the single selected motor drive as a candidate location of a ground fault if a ground fault is detected while the associated local drive disconnect switch is closed and all the inverter switching devices of the single selected motor drive are turned off.

4. The method of claim 3, wherein (iii) enabling the single selected motor drive and (iv) determining whether a ground fault is detected while the single selected motor drive is enabled further comprises:
testing for motor side ground faults by:
(d) sending at least one command or message from the controller to cause the single selected motor drive to turn on at least one inverter switching device of the single selected motor drive while the associated local drive disconnect switch is closed;
(e) using the controller, determining whether a ground fault is detected while at least one of the inverter switching devices of the single selected motor drive is turned on and the associated local drive disconnect switch is closed; and
(f) using the controller, selectively identifying a motor side ground fault at the single selected motor drive as a candidate location of a ground fault if a ground fault is detected while at least one of the inverter switching devices of the single selected motor drive is turned on and the associated local drive disconnect switch is closed.

5. The method of claim 4, wherein (d) sending at least one command or message from the controller to cause the single selected motor drive to turn on at least one inverter switching device of the single selected motor drive comprises sending at least one command or message from the controller to cause the single selected motor drive to rotate a connected motor.

6. The method of claim 4, wherein (d) sending at least one command or message from the controller to cause the single selected motor drive to turn on at least one inverter switching device of the single selected motor drive comprises sending at least one command or message from the controller to cause the single selected motor drive to turn on at least one inverter switching device while preventing rotation of a connected motor.

7. The method of claim 2, wherein (iii) enabling the single selected motor drive and (iv) determining whether a ground fault is detected while the single selected motor drive is enabled comprises:
testing for motor side ground faults by:
(d) sending at least one command or message from the controller to cause the single selected motor drive to turn on at least one inverter switching device of the single selected motor drive while an associated local drive disconnect switch is closed;
(e) using the controller, determining whether a ground fault is detected while at least one of the inverter switching devices of the single selected motor drive is turned on and the associated local drive disconnect switch is closed; and
(f) using the controller, selectively identifying a motor side ground fault at the single selected motor drive as a candidate location of a ground fault if a ground fault is detected while at least one of the inverter switching devices of the single selected motor drive is turned on and the associated local drive disconnect switch is closed.

8. The method of claim 7, wherein (d) sending at least one command or message from the controller to cause the single selected motor drive to turn on at least one inverter switching device of the single selected motor drive comprises sending at least one command or message from the controller to cause the single selected motor drive to rotate a connected motor.

9. The method of claim 7, wherein (d) sending at least one command or message from the controller to cause the single selected motor drive to turn on at least one inverter switching device of the single selected motor drive comprises sending at least one command or message from the controller to cause the single selected motor drive to turn on at least one inverter switching device while preventing rotation of a connected motor.

10. The method of claim 1, wherein (iii) enabling the single selected motor drive and (iv) determining whether a ground fault is detected while the single selected motor drive is enabled comprises:
testing for DC side ground faults by:
(a) sending at least one command or message from the controller to cause the single selected motor drive to close an associated local drive disconnect switch to connect the single selected motor drive to an AC input power source while turning off all inverter switching devices of the single selected motor drive;
(b) using the controller, determining whether a ground fault is detected while the associated local drive disconnect switch is closed and all the inverter switching devices of the single selected motor drive are turned off; and
(c) using the controller, selectively identifying a DC side ground fault at the single selected motor drive as a candidate location of a ground fault if a ground fault is detected while the associated local drive disconnect switch is closed and all the inverter switching devices of the single selected motor drive are turned off.

11. The method of claim 10, wherein (iii) enabling the single selected motor drive and (iv) determining whether a ground fault is detected while the single selected motor drive is enabled comprises:
testing for motor side ground faults by:
(d) sending at least one command or message from the controller to cause the single selected motor drive to turn on at least one inverter switching device of the single selected motor drive while the associated local drive disconnect switch is closed;
(e) using the controller, determining whether a ground fault is detected while at least one of the inverter switching devices of the single selected motor drive is turned on and the associated local drive disconnect switch is closed; and
(f) using the controller, selectively identifying a motor side ground fault at the single selected motor drive as a candidate location of a ground fault if a ground fault is detected while at least one of the inverter switching devices of the single selected motor drive is turned on and the associated local drive disconnect switch is closed.

12. The method of claim 11, wherein (d) sending at least one command or message from the controller to cause the single selected motor drive to turn on at least one inverter switching device of the single selected motor drive comprises sending at least one command or message from the controller to cause the single selected motor drive to rotate a connected motor.

13. The method of claim 11, wherein (d) sending at least one command or message from the controller to cause the single selected motor drive to turn on at least one inverter switching device of the single selected motor drive comprises sending at least one command or message from the controller to cause the single selected motor drive to turn on at least one inverter switching device while preventing rotation of a connected motor.

14. The method of claim 1, wherein (iii) enabling the single selected motor drive and (iv) determining whether a ground fault is detected while the single selected motor drive is enabled comprises:
testing for motor side ground faults by:
(d) sending at least one command or message from the controller to cause the single selected motor drive to turn on at least one inverter switching device of the single selected motor drive while an associated local drive disconnect switch is closed;
(e) using the controller, determining whether a ground fault is detected while at least one of the inverter switching devices of the single selected motor drive is turned on and the associated local drive disconnect switch is closed; and (f) using the controller, selectively identifying a motor side ground fault at the single selected motor drive as a candidate location of a ground fault if a ground fault is detected while at least one of the inverter switching devices of the single selected motor drive is turned on and the associated local drive disconnect switch is closed.

15. The method of claim 14, wherein (d) sending at least one command or message from the controller to cause the single selected motor drive to turn on at least one inverter switching device of the single selected motor drive comprises sending at least one command or message from the controller to cause the single selected motor drive to rotate a connected motor.

16. The method of claim 14, wherein (d) sending at least one command or message from the controller to cause the single selected motor drive to turn on at least one inverter switching device of the single selected motor drive comprises sending at least one command or message from the controller to cause the single selected motor drive to turn on at least one inverter switching device while preventing rotation of a connected motor.

17. A non-transitory computer readable medium with computer executable instructions for automatically identifying candidate ground fault locations in a high resistance grounded multi-drive system with a multiphase AC source including a neutral connected to a system ground through a high resistance, the computer readable medium comprising computer executable instructions for:
  (i) automatically selecting a first one of a plurality of motor drives as a single selected motor drive for testing;
  (ia) automatically close the system main circuit breaker to connect a multiphase AC source to the plurality of motor drives or to a shared rectifier;
  (ii) automatically transmitting at least one network message to disable all non-selected ones of the plurality of motor drives;
  (iii) automatically transmitting at least one network message to enable the single selected motor drive;
  (iv) automatically determining whether a ground fault is detected while the single selected motor drive is enabled and all the non-selected motor drives are disabled;
  (v) automatically identifying the single selected motor drive as a candidate location of a ground fault if a ground fault is detected while the single selected motor drive is enabled and all the non-selected motor drives are disabled; and
  (vi) automatically selecting at least one remaining untested motor drive of the plurality of motor drives for testing, and automatically repeating steps (ii)-(v) to selectively identify one or more candidate locations of the ground fault or to eliminate further ones of the plurality of motor drives from consideration as ground fault locations.

18. A controller for automatically identifying candidate ground fault locations in a high resistance grounded multi-drive system with a multiphase AC source including a neutral connected to a system ground through a high resistance, the controller comprising:
  an electronic memory;
  a network interface operative to provide electronic communications between the controller and a plurality of motor drives via a connected communications network; and
  at least one processor electrically coupled to the electronic memory and to the network interface, the at least one processor being programmed to:
  (i) automatically select a first one of the plurality of motor drives coupled with the communications network as a single selected motor drive for testing;
  (ia) using network messaging, close a system main circuit breaker to connect the multiphase AC source to the plurality of motor drives or to a shared rectifier;
  (ii) using network messaging, automatically disable all non-selected ones of the plurality of motor drives;
  (iii) using network messaging, automatically enable the single selected motor drive;
  (iv) automatically determine whether a ground fault is detected while the single selected motor drive is enabled and all the non-selected motor drives are disabled;
  (v) automatically identify the single selected motor drive as a candidate location of a ground fault if a ground fault is detected while the single selected motor drive is enabled and all the non-selected motor drives are disabled; and
  (vi) automatically select at least one remaining untested motor drive of the plurality of motor drives for testing, and automatically repeat steps (ii)-(v) to selectively identify one or more candidate locations of the ground fault or to eliminate further ones of the plurality of motor drives from consideration as ground fault locations.

19. The controller of claim 18, wherein the at least one processor is programmed to:
  automatically disable all of the plurality of motor drives;
  automatically determine whether a ground fault is detected while all of the plurality of motor drives are disabled and the system main circuit breaker is closed; and
  automatically identify a system input or common DC bus as a candidate location of a ground fault if a ground fault is detected while all of the plurality of motor drives are disabled and the system main circuit breaker is closed.

20. The controller of claim 18, wherein the at least one processor is programmed to test the single selected motor drive for DC side ground faults by:
  automatically sending at least one command or message to cause the single selected motor drive to close an associated local drive disconnect switch to connect the single selected motor drive to an AC input power source while turning off all inverter switching devices of the single selected motor drive;
  automatically determining whether a ground fault is detected while the associated local drive disconnect switch is closed and all the inverter switching devices of the single selected motor drive are turned off; and
  automatically identifying a DC side ground fault at the single selected motor drive as a candidate location of a ground fault if a ground fault is detected while the associated local drive disconnect switch is closed and all the inverter switching devices of the single selected motor drive are turned off.

21. The controller of claim 18, wherein the at least one processor is programmed to test the single selected motor drive for motor side ground faults by:
  automatically sending at least one command or message to cause the single selected motor drive to turn on at least one inverter switching device of the single selected motor drive while an associated local drive disconnect switch is closed;

automatically determining whether a ground fault is detected while at least one of the inverter switching devices of the single selected motor drive is turned on and the associated local drive disconnect switch is closed; and automatically identifying a motor side ground fault at the single selected motor drive as a candidate location of a ground fault if a ground fault is detected while at least one of the inverter switching devices of the single selected motor drive is turned on and the associated local drive disconnect switch is closed.

* * * * *